United States Patent [19]
Chikamichi

[11] Patent Number: 5,742,362
[45] Date of Patent: Apr. 21, 1998

[54] PROCESS FOR FORMING A PHOTOSENSITIVE MATERIAL AND AN EXPOSURE APPARATUS USED FOR THE PROCESS

[75] Inventor: Shoichi Chikamichi, Tokyo, Japan

[73] Assignee: NEC Corporation, Tokyo, Japan

[21] Appl. No.: 262,934

[22] Filed: Jun. 21, 1994

[30] Foreign Application Priority Data

Mar. 21, 1993 [JP] Japan .................................. 5-148744

[51] Int. Cl.$^6$ .............................. G02F 1/13; G03C 1/492
[52] U.S. Cl. ........................................... 349/2; 430/269
[58] Field of Search ........................ 430/269, 270.1; 359/39; 349/2

[56] References Cited

U.S. PATENT DOCUMENTS

| | | |
|---|---|---|
| 4,675,702 | 6/1987 | Gerber . |
| 5,045,419 | 9/1991 | Okumura .................... 359/40 |
| 5,082,755 | 1/1992 | Liu . |
| 5,344,748 | 9/1994 | Feely .................... 430/270.1 |

FOREIGN PATENT DOCUMENTS

| | | |
|---|---|---|
| A2247535 | 3/1992 | United Kingdom . |
| WO91 10170 | 7/1991 | WIPO . |

OTHER PUBLICATIONS

Takamizawa et al., "Multilayer Ceramic Substrate with UV Curable Dielectric Paste for Multi-Chip Package", Proceedings of the 1985 Symposium on Microelectronics, Nov. 1995, pp. 373–379.
Microelectronics Packaging Handbook, Edited by Rao R. Tummala et al., Van Nostrand Reinhold, 1989, pp. 706–708.
IBM Technical Disclosure Bulletin, Aug. 1992.

Primary Examiner—William L. Sikes
Assistant Examiner—Charles Miller
Attorney, Agent, or Firm—Sughrue, Mion, Zinn, Macpeak & Seas, PLLC

[57] ABSTRACT

Mask patterns and their exposure times are stored in a memory within a controller. The controller transfers the mask pattern to a memory in the liquid crystal controller. The mask pattern stored in the memory is displayed on the matrix liquid crystal display element. The controller transfers the next mask pattern to memory after the elapse of exposure time. By this exposure apparatus, a plurality of mask patterns is exposed on a photosensitive material. The exposure time of each portion of the photosensitive material is adjusted in three or more grades by exposing a plurality of mask patterns sequentially. If the photosensitive material is positive, the film thickness becomes low in a portion which has a long exposure time and high in a portion which has a short exposure time. A combination of a plurality of mask patterns enables the section of the photosensitive material to be formed into a desired shape.

5 Claims, 18 Drawing Sheets

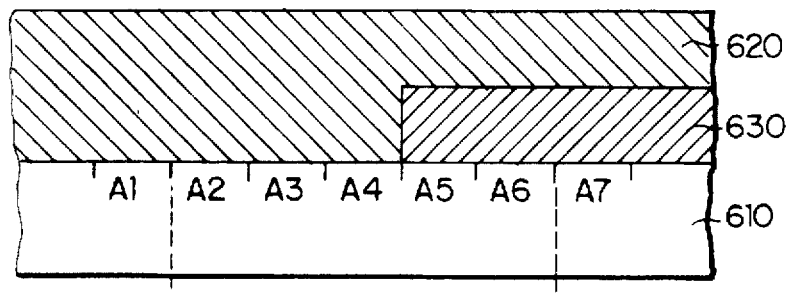
FIG. 1A
PRIOR ART
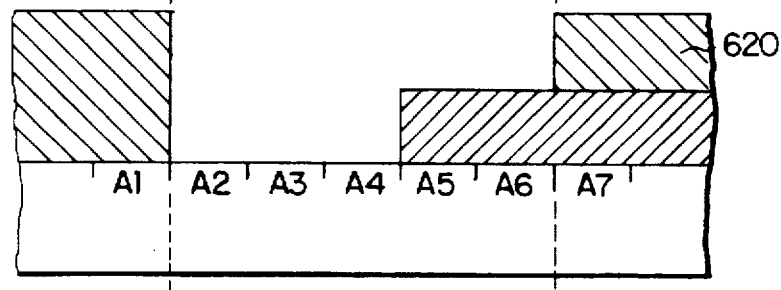
FIG. 1B
PRIOR ART
FIG. 1C
PRIOR ART
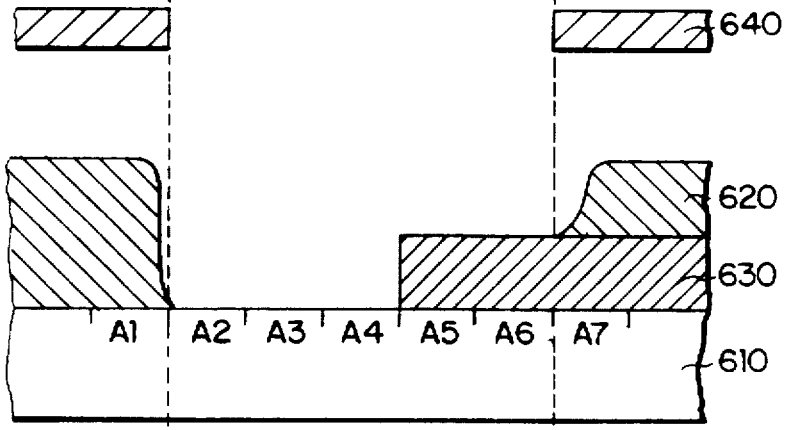
FIG. 1D
PRIOR ART
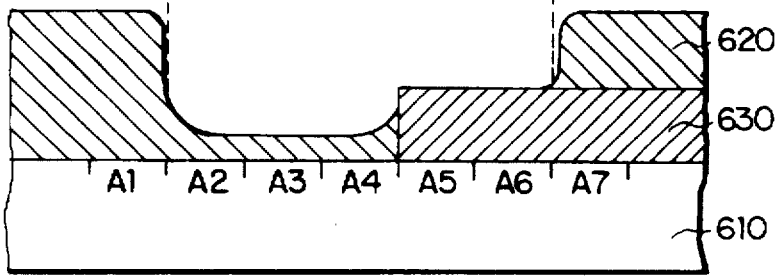
FIG. 1E
PRIOR ART

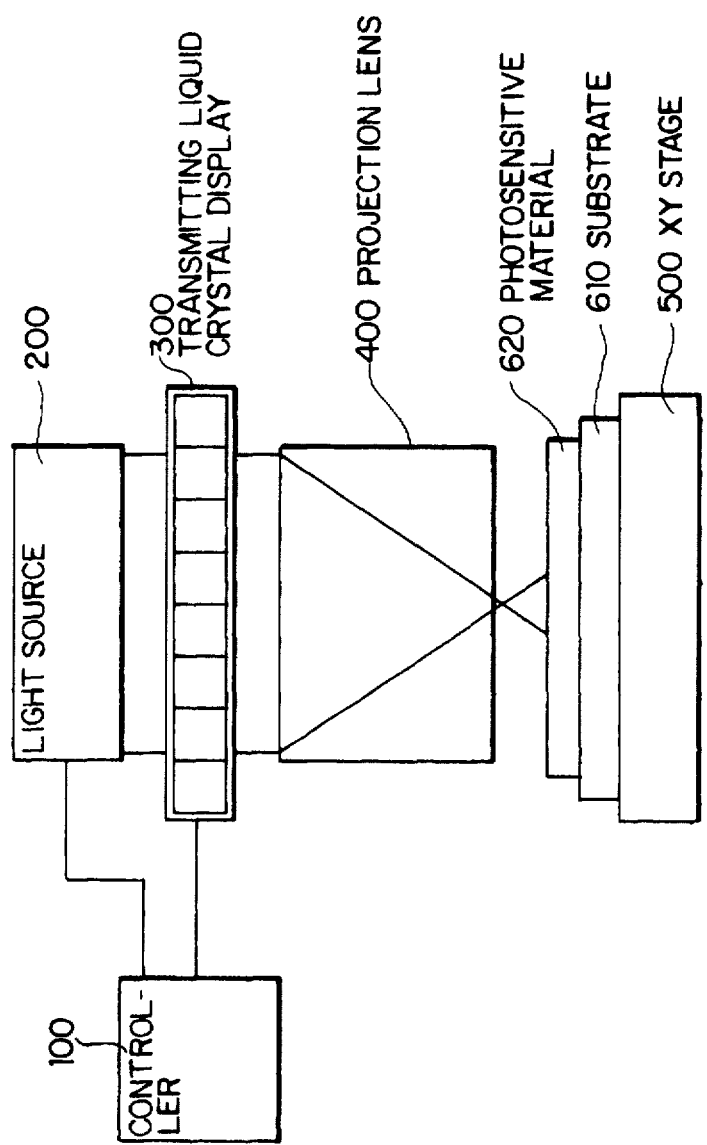

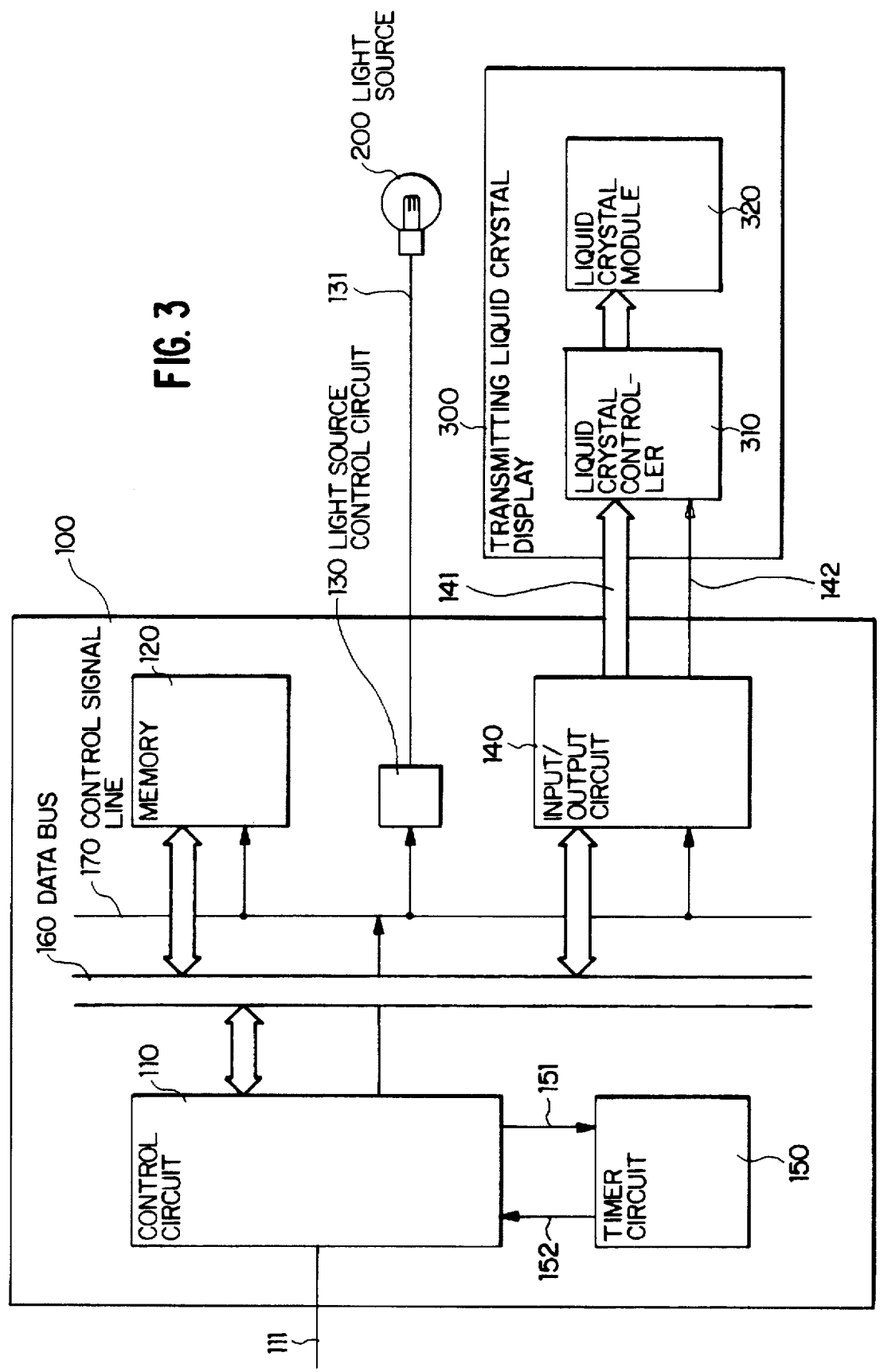

| 10 | 0 | 1 | 1 | 1 | 1 | 1 | 0 | —715 |
| 10 | 0 | 0 | 1 | 1 | 1 | 0 | 0 | —716 |
| 10 | 0 | 0 | 0 | 1 | 0 | 0 | 0 | —717 |

FIG. 14
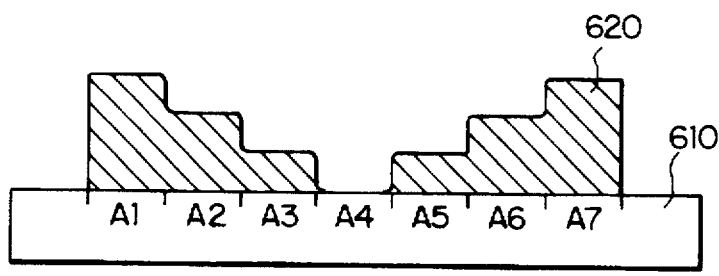
FIG. 15
| 0 | 30 | 30 | 30 | 15 | 15 | 0 |
FIG. 16
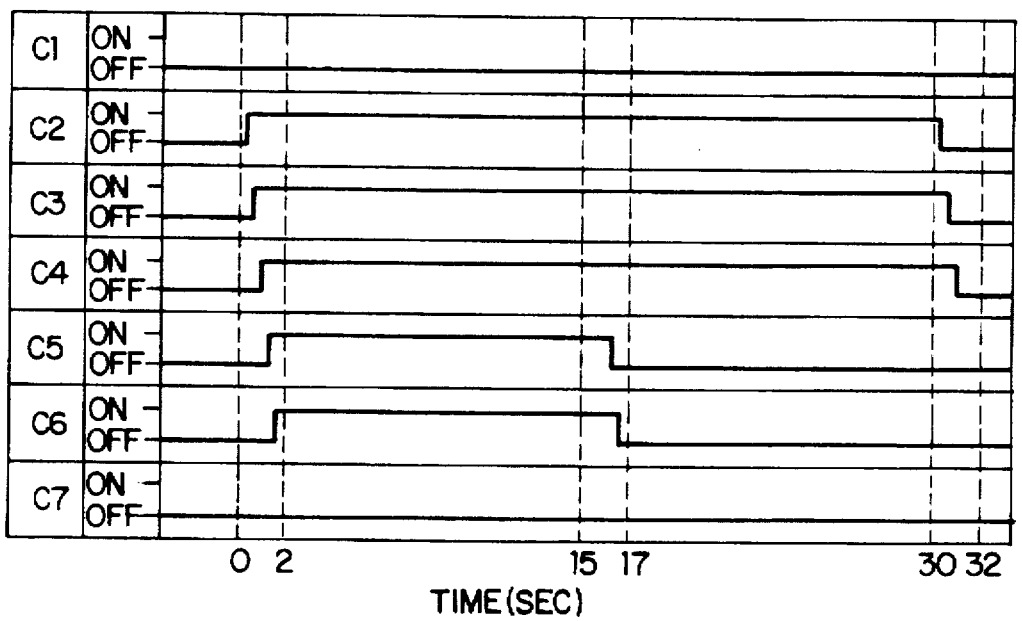

FIG. 21
FIG. 22
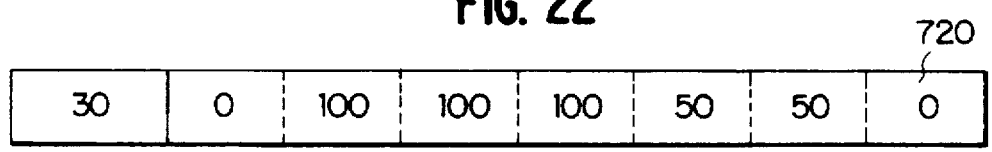
FIG. 24
| 10 | 1 | 1 | 1 | 0 | 1 | 1 | 1 | —721 |
| 10 | 1 | 1 | 0 | 0 | 0 | 1 | 1 | —722 |
| 10 | 1 | 0 | 0 | 0 | 0 | 0 | 1 | —723 |
FIG. 26
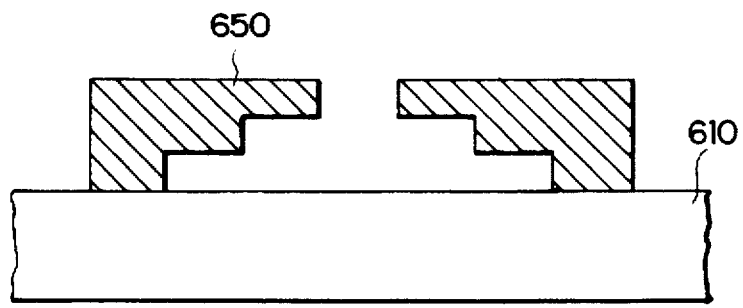

PROCESS FOR FORMING A PHOTOSENSITIVE MATERIAL AND AN EXPOSURE APPARATUS USED FOR THE PROCESS

BACKGROUND OF THE INVENTION

The present invention relates to a process for forming a photosensitive material for the manufacture of wiring boards and, more particularly, to a process for forming the section of a photosensitive material into a desired shape by exposure.

In the manufacture of wiring boards, thick or thin films or predetermined patterns are laminated. One of the techniques for forming a thick or thin film into a predetermined pattern is photolithography. An example of the technique for forming a thick or thin film by the use of photolithography is described in the "Microelectronics Packaging Handbook," Van Nostrand Reinhold, 1989, pp. 706–708. This reference describes a process for forming a thin film but, in the reference, page 706, line 21, it is described that a similar technique can also be applied to form a thick film. Referring to lines 14–21 on page 706 and FIGS. 9–17 on page 708, a photosensitive material is mixed into dielectric slurry which is a raw material for a thin film. The slurry is applied to a substrate by screen-printing. The applied slurry is exposed to ultraviolet light.

The slurry is selectively exposed by means of a photomask having a pattern formed therein for intercepting light. Portions covered by the pattern are not exposed. Unexposed portions of the slurry are washed away. After unexposed portions are washed away, the slurry is fired, forming a thin film having the same pattern as that of the photomask.

In this process, each portion of the photomask either transmits or intercepts light. In addition, the photomask pattern remains unchanged during exposure. For this reason, all portions of the slurry to be exposed are exposed to an equal amount of light.

In the above technique, a thick or thin film is considered to be a two-dimensional pattern, and its sectional configuration is ignored. In addition, no attempt is made to form the section of a thick or thin film into a desired shape.

SUMMARY OF THE INVENTION

It is, therefore, an object of the present invention to provide a process for forming the section of a photosensitive material into a desired shape.

It is another object of the present invention to provide an exposure apparatus to achieve this process.

It is a more detailed object of the present invention to provide an exposure apparatus which can adjust the exposure value of each portion of a photosensitive material in three or more grades.

It is a further object of the present invention to provide an exposure apparatus which eliminates the need for making a photomask corresponding to an exposure pattern.

In a preferred embodiment of the present invention, the exposure value being adjusted in three or more grades. The exposure value is the amount of exposed light. If exposure value can be changed by controlling either exposure time or transmissivity of mask pattern. When a positive photosensitive material is exposed, exposure value is adjusted so that it is small for a portion of the film thickness which is thick and is large for a portion of the film thickness of which is thin. When a negative photosensitive material is exposed, hollow space can be formed in desired portion by setting the exposure value of the portion smaller than the other portions.

The present invention includes an exposure apparatus that executes above stated novel process. In a preferred embodiment of the present invention, an exposure apparatus comprises a liquid crystal display for displaying a mask pattern and a memory means. The memory means stores a plurality of mask patterns to be displayed on the liquid crystal display and exposure time for them. By displaying a plurality of mask patterns on the liquid crystal sequentially, exposure time for each portion of the photosensitive material can be controlled. When the next mask pattern is displayed, a temporary pattern appears on the liquid crystal display. When the temporary pattern disturbs an accurate exposure time controlling, the light source is turned off during the switching of mask patterns.

In another preferred embodiment, the exposure apparatus of the present invention, the memory means stores a transmissivity pattern. The transmissivity of each cell of the liquid crystal display element is adjusted in accordance with the transmissivity pattern.

BRIEF DESCRIPTION OF THE DRAWINGS

Other objects, features, and advantages of the present invention will become more apparent when the following description is read in conjunction with the accompanying drawings, wherein:

FIGS. 1A–1E illustrate the sectional shapes of a photosensitive material formed by the prior art;

FIG. 2 is a block diagram of the first embodiment of the present invention;

FIG. 3 is a block diagram detailing the structure of the first embodiment of the present invention;

FIG. 8 shows an example of mask data 700;

FIG. 14 illustrates the sectional shape of a positive photosensitive material 620 formed by the first embodiment of the present invention;

FIG. 15 shows another configuration of mask data 700;

FIG. 16 shows the operation of the second embodiment of the present invention;

FIG. 21 shows the configuration of mask data 700 in the fourth embodiment of the invention of this application;

FIG. 22 shows an example of mask data 700 of the fourth embodiment of the present invention;

FIG. 24 is shows an example of mask data 700;

FIG. 26 illustrates the sectional shape of a negative photosensitive material 650 formed by the first embodiment of the present invention.

In these Figures, the same reference numerals depict the same parts, respectively.

DESCRIPTION OF THE PREFERRED EMBODIMENTS

Figure 4:
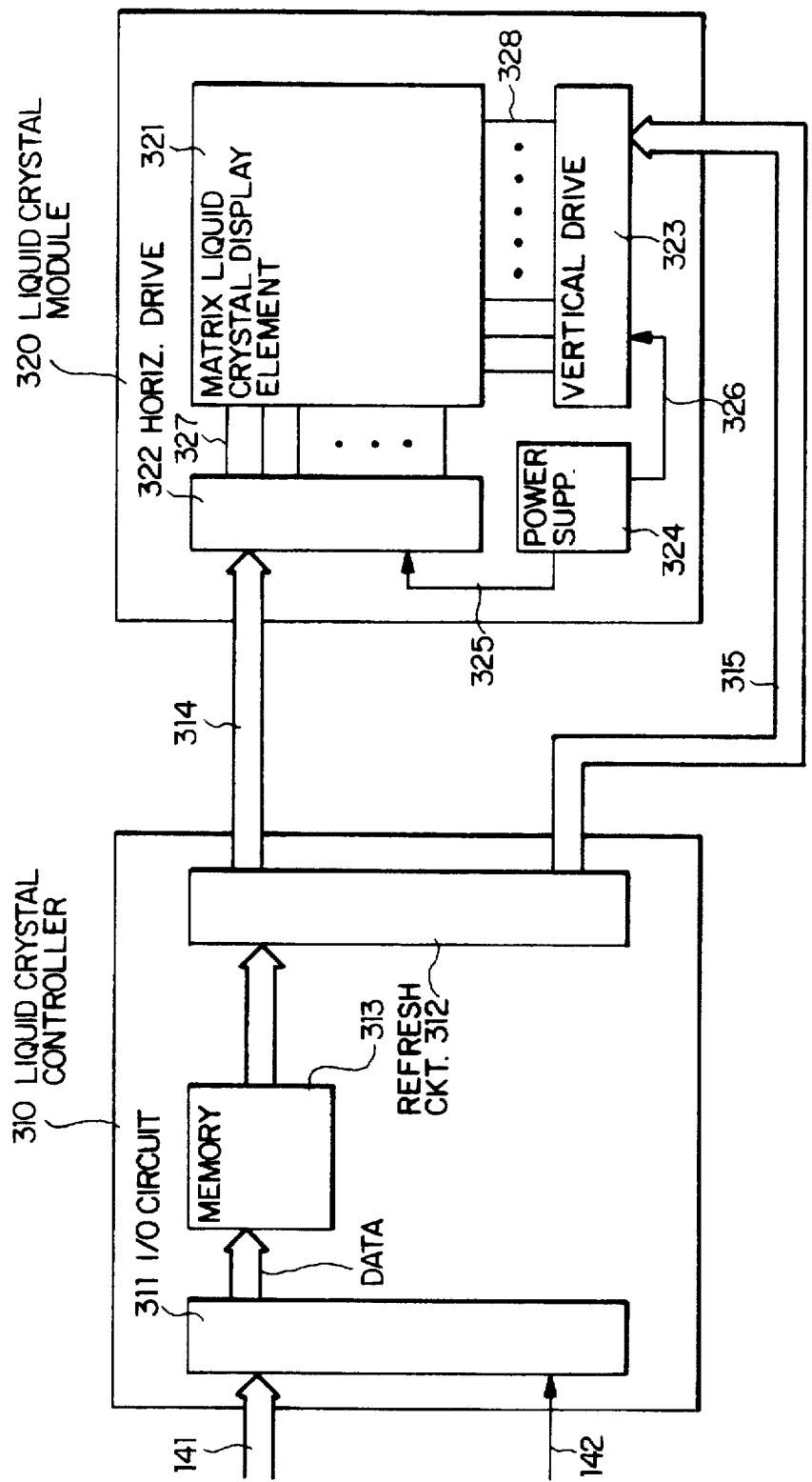
FIG. 4 is a block diagram showing the construction of the liquid crystal display 300.

Before describing an embodiment of the present invention, the need for forming the section of a photosensitive material into a desired shape is explained.

The shaping of the section of a photosensitive material is, for example, required in the case that the thickness of the photosensitive material differs in various parts thereof. An example of such a structure is shown in FIG. 1. Referring to FIG. 1A, a pad 630 is preformed in regions A5–A7 on a substrate 610. Further, on the substrate 610, a positive photosensitive material 620 is applied to the entire surface. Since the pad 630 is formed, the thickness of the positive photosensitive material 620 is great in regions A1–A4 and little in A5–A7. That is, the thickness of the positive photosensitive material 620 differs across the substrate 610.

A case is described in which a positive photosensitive material 620 in FIG. 1A is shaped into a desired section as shown in FIG. 1B. The section in FIG. 1B shows an ideal shape for a photosensitive material patterned by the above mentioned prior art. In this case, in the above described prior art, the positive photosensitive material 620 is exposed to light using a photomask 640 shown in FIG. 1C. The exposed portion of the positive photosensitive material 620 is softened and removed.

However, the following disadvantage occurs in such a process: That is, if the exposure time is set to remove positive photosensitive material 620 on regions A2–A4, exposure would be excessive in region A6. Thus, part of region A7 which originally was not to be removed would be removed as shown in FIG. 1D. Further, if the exposure time is set to avoid over exposure in regions A5 and A6, exposure would be insufficient in regions A2–A4. Thus, positive photosensitive material 620 would remain in regions A2–A4 as shown in FIG. 1E. Therefore, in the prior art, the section of the positive photosensitive material 620 in FIG. 1A cannot be formed into the ideal shape in FIG. 1B.

The present invention is described below with reference to the drawings.

Referring to FIG. 2, the thick-film wiring pattern exposure apparatus of the first embodiment of the present invention includes a light source 200 for exposing a positive photosensitive material 620 to light. A transmitting liquid crystal display 300 transmits light emitted from the light source 200. Light transmitted by the liquid crystal display 300 is focused using a projection lens 400. The focused light reaches substrate 610 fixed on an XY stage 500. The substrate 610 is coated with a positive photosensitive material 620. The light source 200 and the liquid crystal display 300 are controlled by a controller 100.

Referring to FIG. 3, the controller 100 includes memory 120, a light source control circuit 130, an input/output circuit 140, a control circuit 110, and a timer circuit 150. Data for controlling the liquid crystal display 300 is stored in a memory 120. The light source control circuit 130 turns the light source 200 on and off. The input/output circuit 140 controls the sending and receiving of a signal to the liquid crystal display 300. The control circuit 110 controls the memory 120, the light source control circuit 130, and the input/output circuit 140. A timer circuit 150 notifies the control circuit 110 of the lapse of time set by the control circuit 110.

The liquid crystal display 300 consists of a liquid crystal module 320 which performs liquid crystal display and a liquid crystal controller 310 which controls a liquid crystal module 320.

Referring to FIG. 4, the liquid crystal controller 310 comprises an input/output circuit 311, a memory 313, and a refresh circuit 312. The input/output circuit 311 receives the signal sent from the controller 100. Data received by the input/output circuit 311 is stored in the memory 313. The refresh circuit 312 generates a signal for controlling the liquid crystal element based on the data stored in the memory 313.

The liquid crystal module 320 comprises a matrix liquid crystal display element 321, a horizontal drive 322, a vertical drive 323, and a power supply 324. The horizontal drive 322 controls the voltage of horizontal electrodes in the matrix liquid crystal display element 321 based on a signal sent from the refresh circuit 312. The vertical drive 323 controls the voltage of vertical electrodes in the matrix liquid crystal display element 321 based on a signal sent from the refresh circuit 312. The power supply 324 supplies power to the horizontal drive 322 and vertical drive 323.

Figure 5:
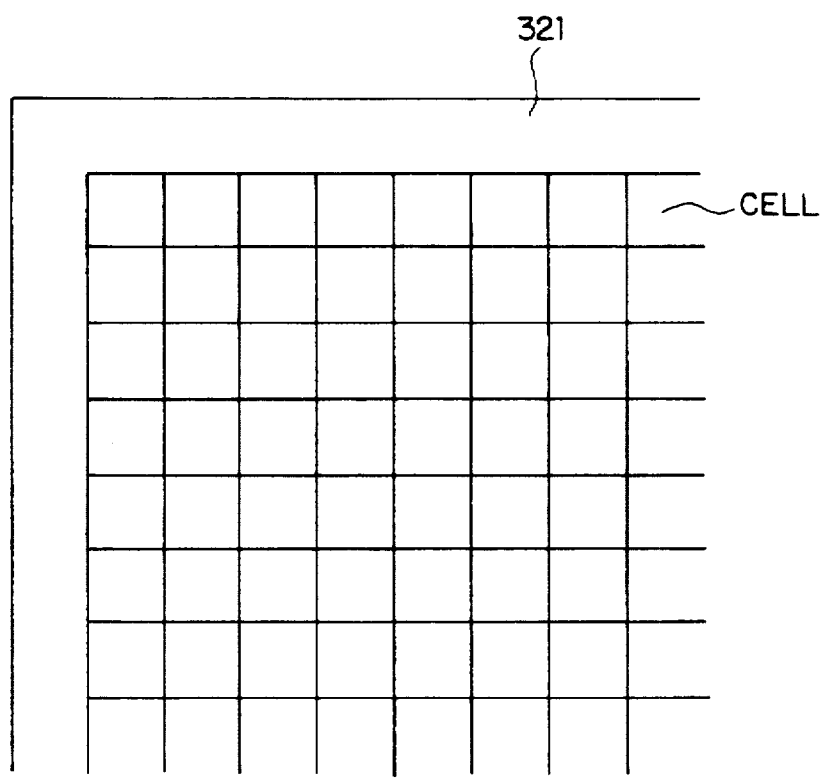
FIG. 5 illustrates showing the construction of the matrix liquid crystal display element 321.

Referring to FIG. 5, the matrix liquid crystal display element 321 has a large number of cells arranged in a grid. Cells are intersections of horizontal and vertical electrodes in the matrix liquid crystal display element 321. The transmission of each cell can be controlled. In this embodiment, each cell is set to either a transmission state for transmitting light (hereinafter referred to as "on") or an interception state for intercepting light (hereinafter referred to as "off").

As shown in FIG. 5, the matrix liquid crystal element 321 is a two-dimensional display element. However, for simplicity, it is hereinafter described as a one-dimensional structure, as shown in FIG. 6.

Figure 6:
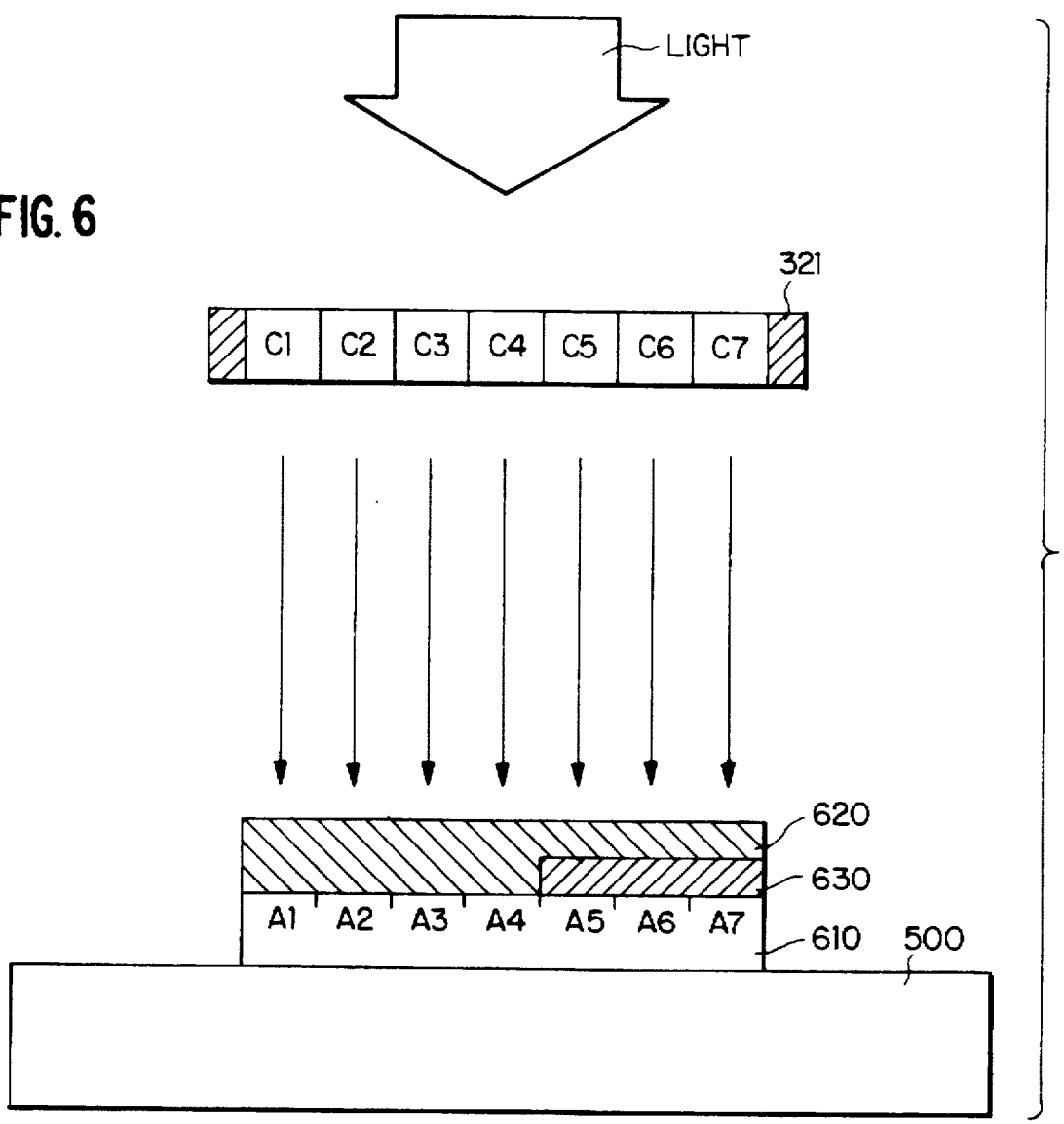
FIG. 6 illustrates the structure of the present embodiment simplified.

Referring to FIG. 6, the matrix liquid crystal display element 321 has seven cells C1–C7 arranged in a straight line. The light emitted from the light source 200 passes through the matrix liquid crystal display element 321 and irradiated is onto the positive photosensitive material 620. Referring to FIG. 2, the projection lens 400 is originally placed between the matrix liquid crystal display element 321 and the positive photosensitive material 620. Threfore, light is inverted and irradiated onto the positive photosensitive material 620. For simplicity, however, the action of inversion of the projection lens 400 is not considered here. Thus, referring to FIG. 6, the light that has passed cell C1 is irradiated onto region A1 beneath cell C1. Similarly, light passing cell Ci is irradiated onto region Ai, where i is an integer from 1 to 7.

The operation of this embodiment is described below with reference to FIGS. 3–11, in connection with a process for forming a section of the positive photosensitive material 620 in FIG. 1A into the shape shown in FIG. 1B. In this case, it is assumed that the optimum exposure time is 30 seconds for regions A2–A4 and 15 seconds for regions A5 and A6.

Figure 7:
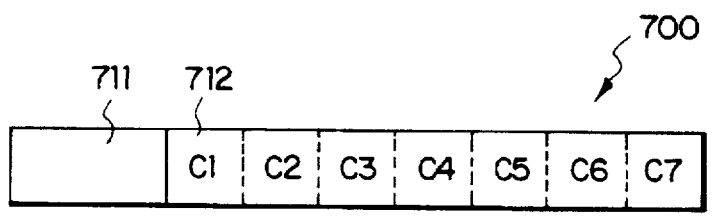
FIG. 7 shows the configuration of mask data 700.

Referring to FIGS. 3 and 7, a plurality of mask data 700 is stored in the memory 120. The mask data 700 is for controlling the matrix liquid crystal display element 321. The mask data 700 consists of exposure time 711 and a mask pattern 712. In the mask pattern 712, a seven-digit binary number corresponding to the states of cells C1–C7 is held. It is assumed that "0" indicates off and "1" indicates on. For instance, mask data 713 shown in FIG. 8 indicates that cells C2–C6 are set on for 15 seconds.

Referring to FIGS. 3 and 8, in this process, two items of mask data 713 and 714 are stored in the memory 120. Mask data 713 and 714 are for forming the section of the photosensitive material 620 in FIG. 1A into the shape shown in FIG. 1B.

Referring to FIG. 3, the operation of the exposure apparatus starts when the control circuit 110 receives an operation start signal from the signal line 111.

Figure 9:
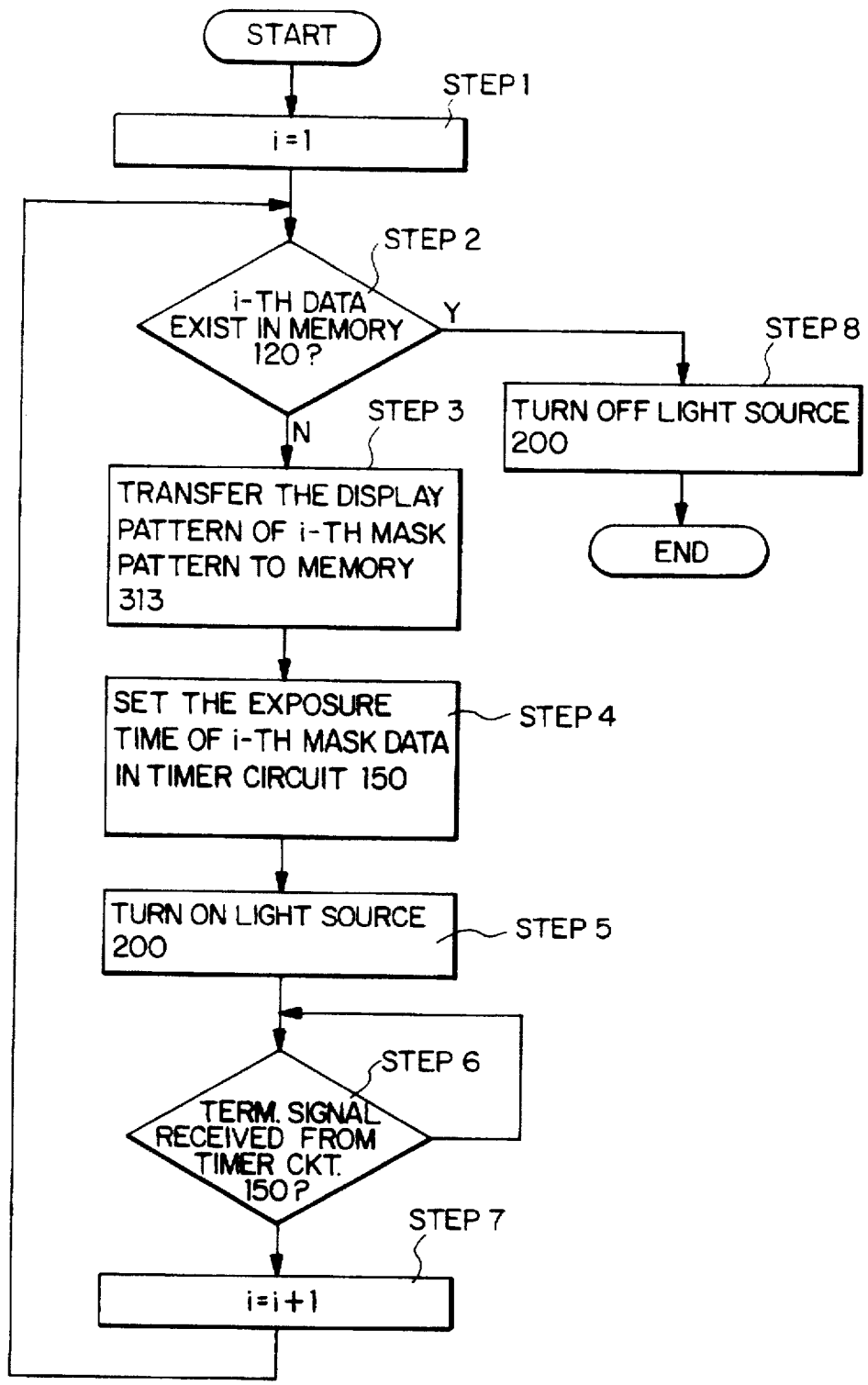
FIG. 9 is a flowchart showing the operation of the control circuit 110 of the first embodiment of the present invention.

Referring to FIGS. 3 and 9, the control circuit 110 sets variable i to 1 in step 1, where variable i is a variable held in a register in the control circuit 110.

In step 2, the control circuit 110 checks for the first data in the memory 120. In this case, since matrix data 713 is stored in the memory 120, the control circuit 110 goes to step 3.

Referring to FIGS. 3, 4, 8 and 9, in the step 3, the control circuit 110 transfers the mask pattern of mask data 713, which is the first mask data, to the memory 313. Referring to FIG. 3, the mask pattern of matrix data 713 is transferred to the memory 313 through the data bus 160, the input/output circuit 140, the signal line 141, and the input/output circuit 311. In this case, "0111110" shown in FIG. 8 is transferred to the memory 313. The refresh circuit 312 controls the horizontal drive 322 and the vertical drive 323 based on the mask pattern transferred to the memory 313, thereby displaying the mask pattern on the matrix liquid crystal display element 321. In this case, cells C2–C6 are turned on.

Referring to FIGS. 3, 8 and 9, in step 4, the control circuit 110 reads, from the memory 120, the exposure time of 15 seconds held in matrix data 713 and sets it in the timer circuit 150 through the signal line 151. The timer circuit 150 starts to measure time simultaneously with the setting of the exposure time.

In step 5, the control circuit 110 sends out a control signal to the light source control circuit 130 via the control signal line 170 to turn on light source 200.

In step 6, the control circuit 110 stops operation and waits until the timer circuit 150 reports completion of timing. Receiving this report from the timer circuit 150 via the signal line 152, the control circuit 110 goes to step 7.

In the step 7, the control circuit 110 increments the value of variable i by one. When the step 7 is completed, the control circuit 110 returns to step 2.

In the step 2, since matrix data 714, the second data, is in the memory 120, the control circuit 110 goes to the step 3.

The control circuit 110 transfers the mask pattern of matrix data 714 to the memory 313. In this case, the pattern "0111000" shown in FIG. 8 is transferred to the memory 313. In the matrix liquid crystal display element 321, only cells C2–C4 are turned on and other cells are turned off.

In the step 4, the control circuit 110 sets the exposure time of 15 seconds held in matrix data 714 in the timer circuit 150. An exposure time being set, timer circuit 150 starts measuring time.

In the step 5, the control circuit 110 turns on the light source 200. In this case, since the light source 200 is already on, no new action is taken.

In the step 6, the control circuit 110 stops and waits until the timer circuit 150 reports the lapse of the set time. Upon receipt of this report from the timer circuit 150, the controller 100 goes to the step 7.

In the step 7, the controller 100 increments variable i by one and returns to step 2.

In the step 2, since no third data is stored in the memory 120, the control circuit 110 goes to step 8.

In the step 8, the control circuit 110 turns off the light source 200. The completion of the step 8 completes operation.

Figure 10B:
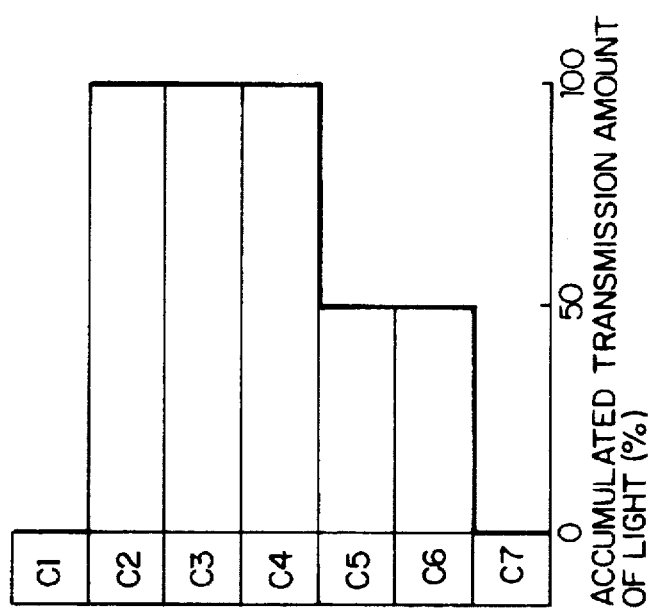
FIG. 10B shows the accumulated amount of transmitted light for each cell.
Figure 10A:
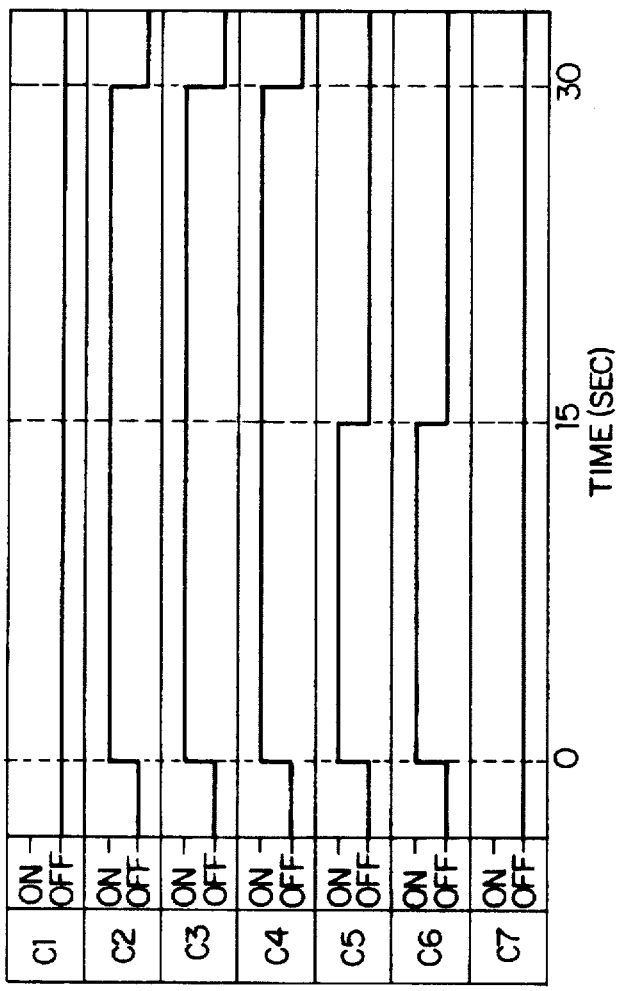
FIG. 10A is a timing chart showing an example of operation of the first embodiment of the present invention.

FIG. 10A shows the change in each cell state in the above described series of operations. Referring to this figure, cells C2–C4 were on for 30 seconds and cells C5 and C6 were on 15 seconds from the start of the operation. Cells C1 and C7 are always off during the operation.

FIG. 10B shows the accumulated amount of the light that each cell transmitted in the above stated process. Referring to this figure, the accumulated amount of transmission for each cell is indicated by a percentage. Namely, the largest value for the cell transmitting is defined as 100 percent. The accumulated amount of transmission for cells C5 and C6 is half that of cells C2–C4.

The description below relates to the shape of the positive photosensitive material 620 formed by the above described process. In the above operation, the exposure time for regions A2–A4 is 30 seconds, which is preferred for these regions. The exposure time for regions A5 and A6, however, is 15 seconds, which is preferred for these regions. That is, the exposure time of each region is optimum for all regions. Therefore, the section of positive photosensitive material 620 is formed in the ideal shape shown in FIG. 11 after the uncured portion is washed away.

The preferred positive photosensitive materials are as follows: for thin films, OFPR-2, manufactured by Tokyo Ouka Kogyo (KK); RI-7179P, manufactured by Hitachi Kasei Kogyo (KK); etc. For thick films, a mixture of inorganic oxide powder and positive photosensitive vehicle is used.

Another aspect of this embodiment is described as follows.

Figures 11, 12:
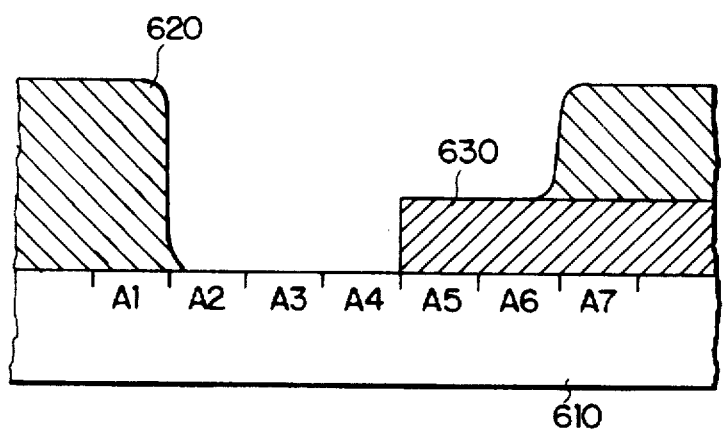
FIG. 11 illustrates the sectional shape of a positive photosensitive material 620 formed by the first embodiment of the present invention.
FIG. 12 shows another example of mask data 700 stored in memory 120.
Figure 13B:
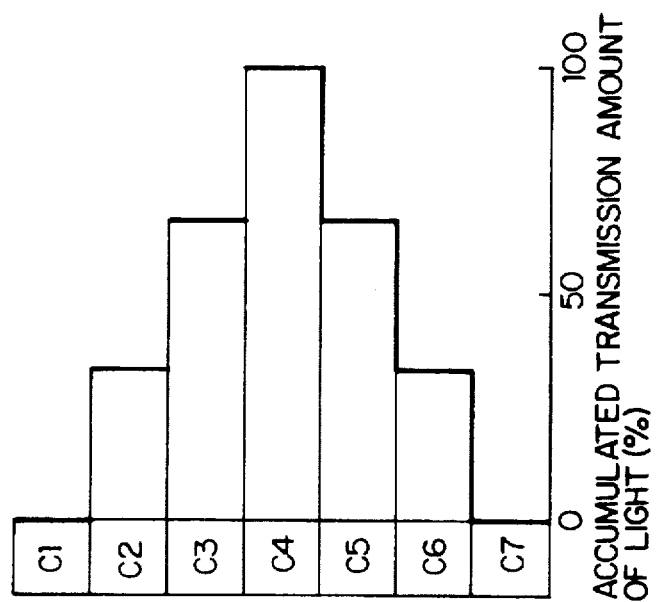
FIG. 13B shows the accumulated amount of transmitted light for each cell.
Figure 13A:
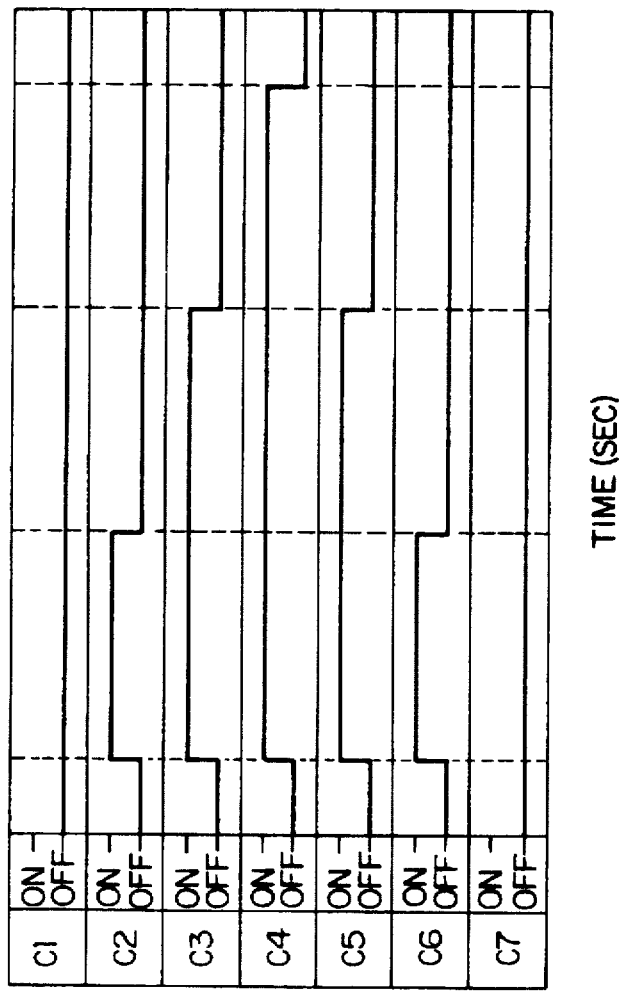
FIG. 13A is a timing chart showing another example of operation of the first embodiment of the present invention.

Firstly, in the above description, a pad 630 is formed on a substrate 610, but the scope of the present invention is not limited to such a case. That is, by changing mask data 700, the section of positive photosensitive material 620 can be formed into various shapes. For example, mask data 715–717 shown in FIG. 12 is stored in the memory 120. In this case, the on/off state of each cell changes with time and the accumulated amount of the light transmitted through each cell is shown in FIGS. 13A and 13B. That is, the accumulated amount of transmitted light for cells C2 and C6 is about one third that of cell C4, and the accumulated amount of transmitted light for cells C3 and C5 is about two thirds that of cell C4. Accordingly, the section of positive photosensitive material 620 is formed into the shape in FIG. 14.

Secondly, the structure of mask data can be modified. For example, as shown in FIG. 15 mask data may hold time intervals during which the respective cells are on. In this case, the control circuit 110 sequentially turns off cells in the sequence of lapsed time.

The effect achieved by this embodiment is described below.

In this embodiment, since each cell of the matrix liquid crystal display element 321 is made transparent for a predetermined time, each region on the substrate 610 can be exposed at different exposure time. That is, the exposure value can be changed for each region. More particularly, with the exposure apparatus of this embodiment, the exposure value of a photosensitive material can be adjusted in three or more grades. By preparing complex mask data, the section of a positive photosensitive material 620 can be formed into any shape. The exposure value is adjusted small for the portion where the desired film thickness is thick. The exposure time is adjusted large for the portion where the desired film thickness is thin. By adjusting the exposure value finely by using many different types of mask data sequentially, the section of the photosensitive material can be formed into a complex shape.

The second embodiment is described below with reference to FIGS. 16–18. It is the object of the second embodiment to prevent a temporary pattern displayed on the matrix liquid crystal display element 321 from being projected onto the photosensitive material. The exposure value for each portion of the photosensitive material can be accurately controlled. To accomplish this object in the second embodiment, the operation of the first embodiment shown in FIG. 9 has a step for turning off the light source 200 immediately after the step 2. The remaining construction and operation are the same as those of the first embodiment.

The object of the second embodiment is described below. The second embodiment is applied to where the matrix liquid crystal display element 321 shown in FIG. 4 has a large number of cells. When the number of cells is large, the amount of data for the mask pattern 712 of mask data 700 shown in FIG. 7 is huge. Threrfore, it takes a long time to transfer mask pattern 712 from the memory 120 shown in FIG. 3 to the memory 313 shown in FIG. 4. Consequently, a long time is required to switch the mask pattern displayed on the matrix liquid crystal element 321. FIG. 16 shows the operation of each cell for such a case.

Referring to FIG. 16, the respective cells are sequentially controlled from C1 to C7, and the control of each cell is accompanied with some time lag. For instance, the mask pattern 712 requires two seconds for transfer. That is, the transfer of the mask pattern 712 is performed during period of 0–2 seconds, 15–17 seconds, and 30–32 seconds. During such a period, a temporary pattern different from the predetermined pattern is displayed on the matrix liquid crystal display element 321.

The temporary pattern on the matrix liquid crystal display element 321 may cause inaccuracy in the control of exposure time. Thus, it is the object of this embodiment to prevent any inaccuracy in the control of exposure time by avoiding the display of a temporary pattern.

Figure 17:
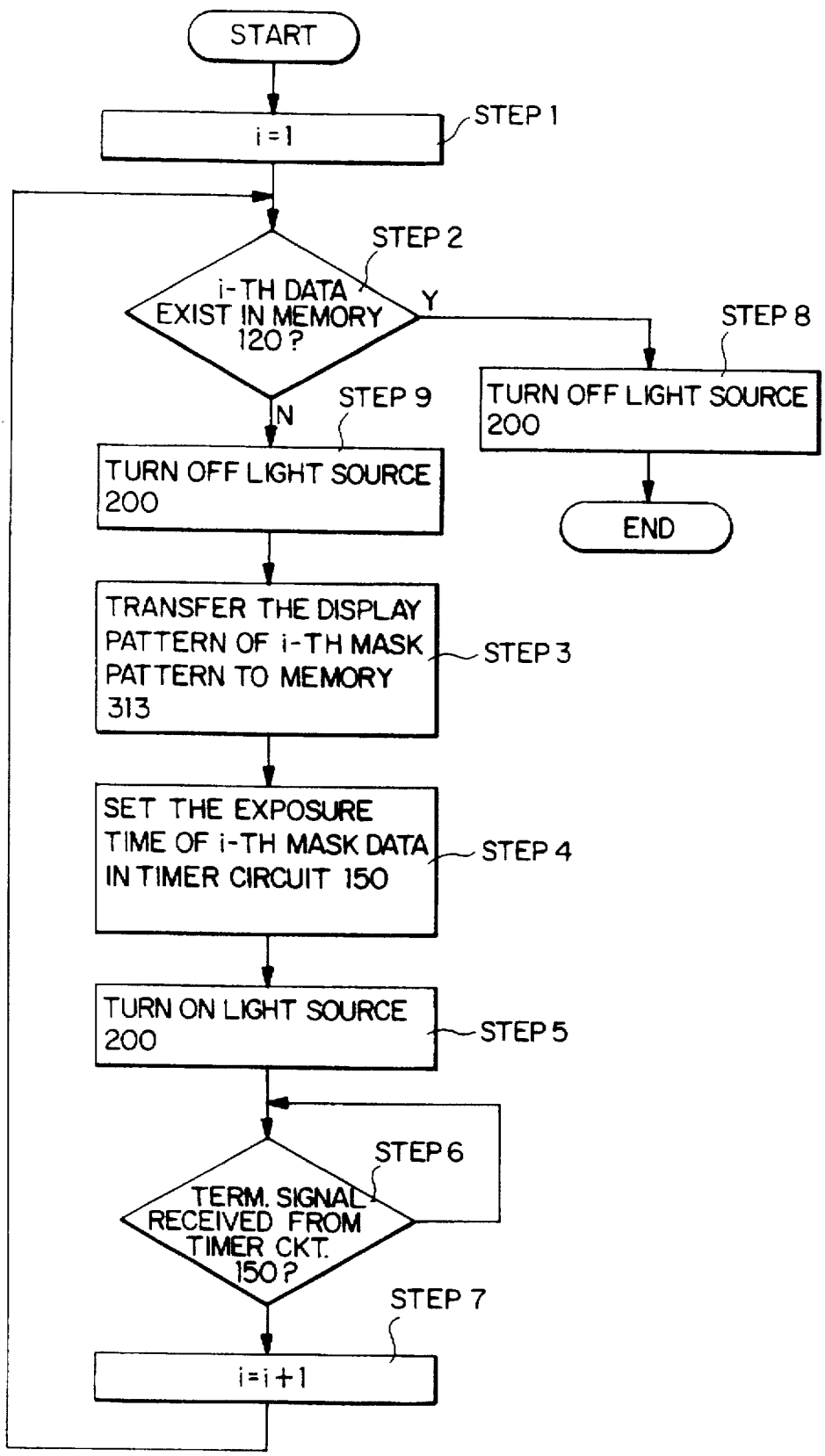
FIG. 17 is a flowchart showing the operation of the control circuit 110 of the second embodiment of the present invention.

Referring to FIG. 17, in this embodiment, step 9 for turning off the light source 200 is inserted after the step 2.

Thus, in this embodiment, the light source 200 is turned off during transfer of the mask pattern 712 from the memory 120 to the memory 313.

The operation of this embodiment is described below.

Figure 18:
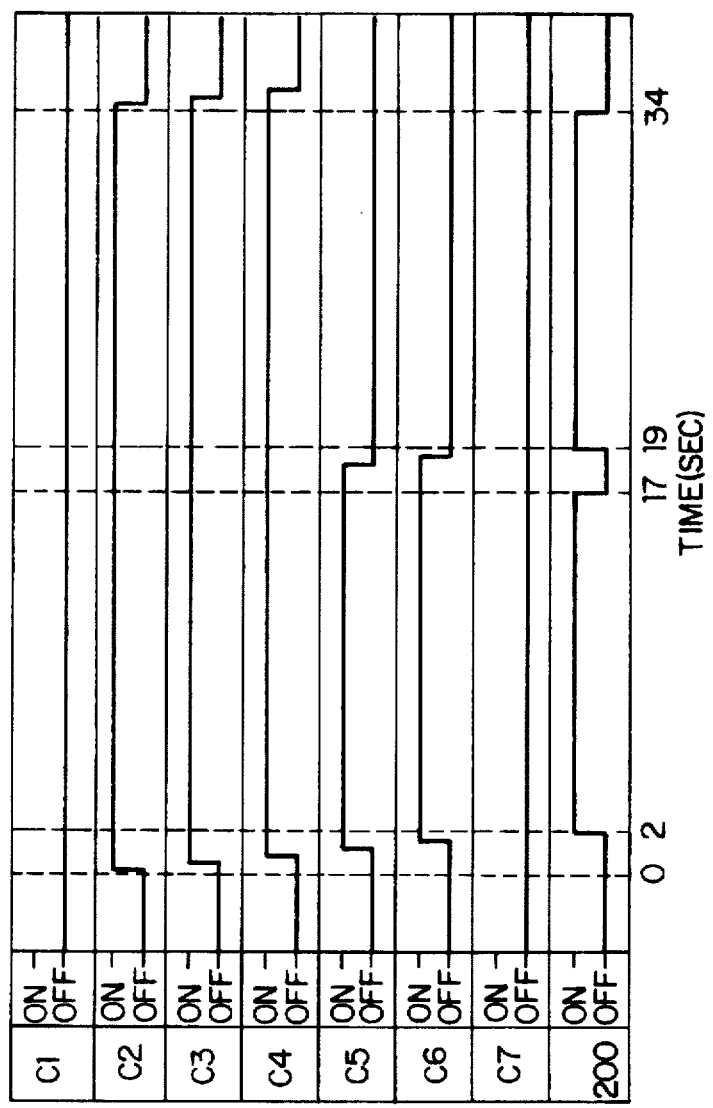
FIG. 18 is a timing chart showing the operation of the second embodiment of the present invention.

Referring to FIG. 18, a temporary pattern is displayed on the matrix liquid crystal display element 321 during periods of 0–2 seconds, 17–19 seconds, and 34–36 seconds. The light source 200 is turned off during these periods. Accordingly, during these periods, the mask pattern of the matrix liquid crystal display element 321 is not exposed to light. Again referring to FIG. 17, the timing of the timer circuit 150 is not performed while the light source 200 is off, and starts after the light source 200 is turned on. Thus, even if the light source 200 is temporarily turned off during the operation, the exposure time remains unchanged.

The effect of this embodiment is described below.

In this embodiment, since the light source 200 is turned off while a temporary pattern is displayed on the matrix liquid crystal display element 321, the temporary pattern is not projected onto the positive photosensitive material 620. Since projection of the temporary pattern is avoided, the exposure value for each region of the photosensitive material can be accurately controlled. As a result, the sectional shape of the photosensitive material can be formed accurately.

The third embodiment of the present invention is described below in detail with reference to the drawings.

Figure 19:
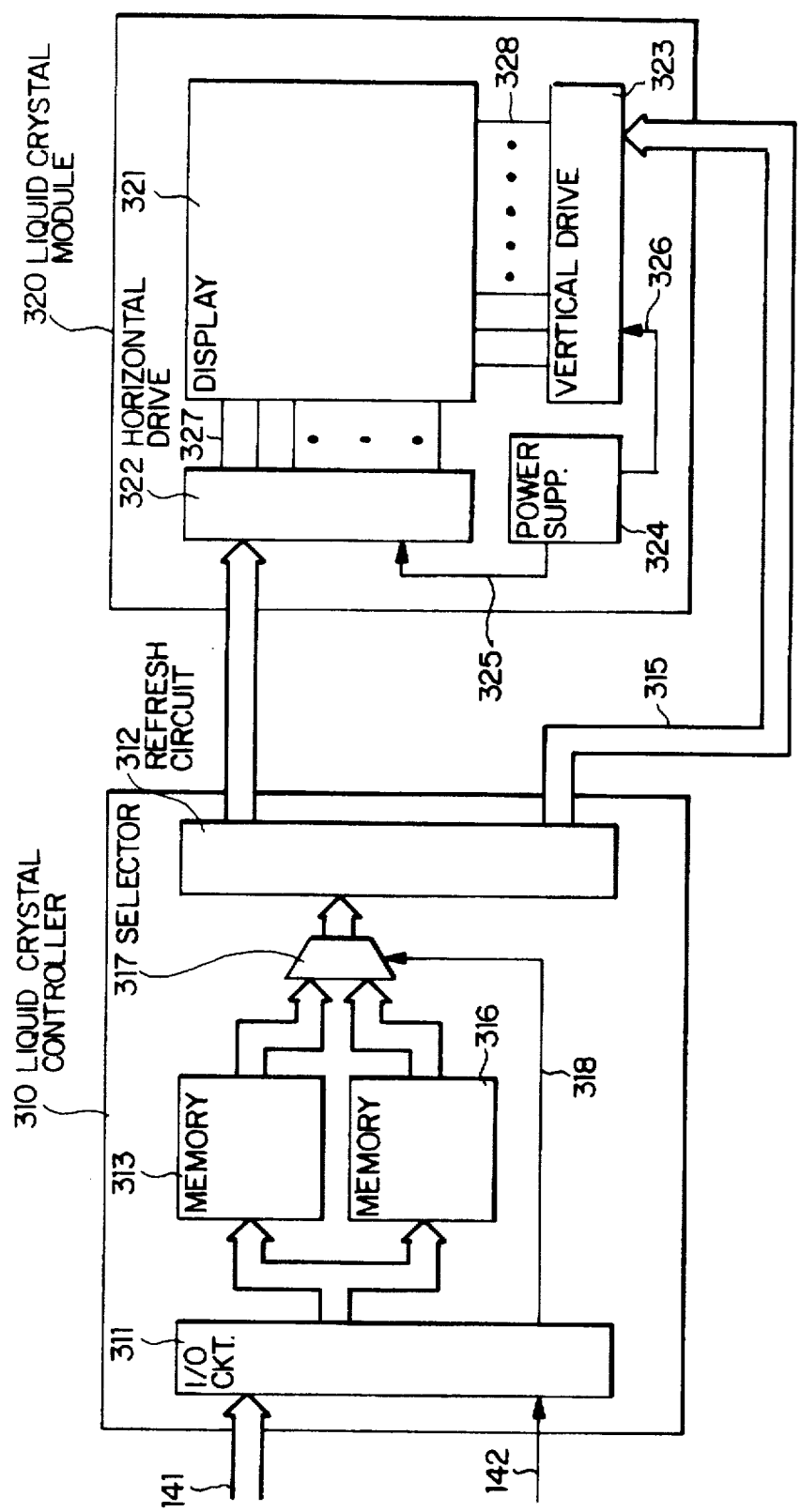
FIG. 19 is a block diagram showing the structure of the third embodiment of the present invention.

Referring to FIG. 19, an object of the third embodiment is to switch the display of the matrix liquid crystal display element 321 instantly. If the display switches instantly, no temporary pattern appears on the matrix display element 321. Thus, the exposure value for each portion of a photosensitive material can be controlled accurately. To accomplish this object, the third embodiment comprises two memories and one selector in the liquid crystal controller 310. The remaining construction is the same as that of the first embodiment.

The liquid crystal controller 310 of this embodiment has a memory 313, a memory 316, and a selector 317. The selector 317 selects the output of either the memory 313 or the memory 316 based on a selection signal. The selection signal is sent from the input/output circuit 311 and received via the signal line 318. The refresh circuit 312 displays the contents of the memory 313 or the memory 316 selected by the selector 317 on the matrix liquid crystal display element 321.

The operation of this embodiment is described below.

It is assumed that the memory 313 is selected by selector 317 at the first time. The mask pattern stored in the memory 313 is then displayed on the matrix liquid crystal display element 321. If the exposure time of the mask pattern stored in the memory 313 elapses, a new mask pattern is sent from the controller 100 shown in FIG. 3. At this point, the input/output circuit 311 sends received display data to one of the memory 313 and the memory 316 not selected by the selector 317. In this case, the new mask pattern is sent to the memory 316. After the new mask pattern is stored in the memory 316, the input/output circuit 311 sends a selection signal to the selector 317 to select the memory 316. This causes the new mask pattern stored in the memory 316 to be displayed on the matrix liquid crystal display element 321. This display switching is instantly completed simultaneously with the switching of the selector 317. No temporary pattern is displayed on the matrix liquid crystal display element 321.

The effect of this embodiment is described as follows:

In this embodiment, two memories are provided in the liquid crystal controller 310, and the mask pattern stored in the memory selected by the selector is displayed. When the mask pattern of the matrix liquid crystal display element 321 is switched, the mask pattern to be displayed next is pre-stored in the memory not selected and, thereafter, the contents of this memory are selected by the selector. The display switching of the matrix liquid crystal display element 321 is instantly completed and no temporary pattern is displayed.

The fourth embodiment of the present invention is described below.

The feature of this embodiment is to provide a gradation voltage generator 329 in the liquid crystal module 320.

First, the construction of this embodiment is described.

Figure 20:
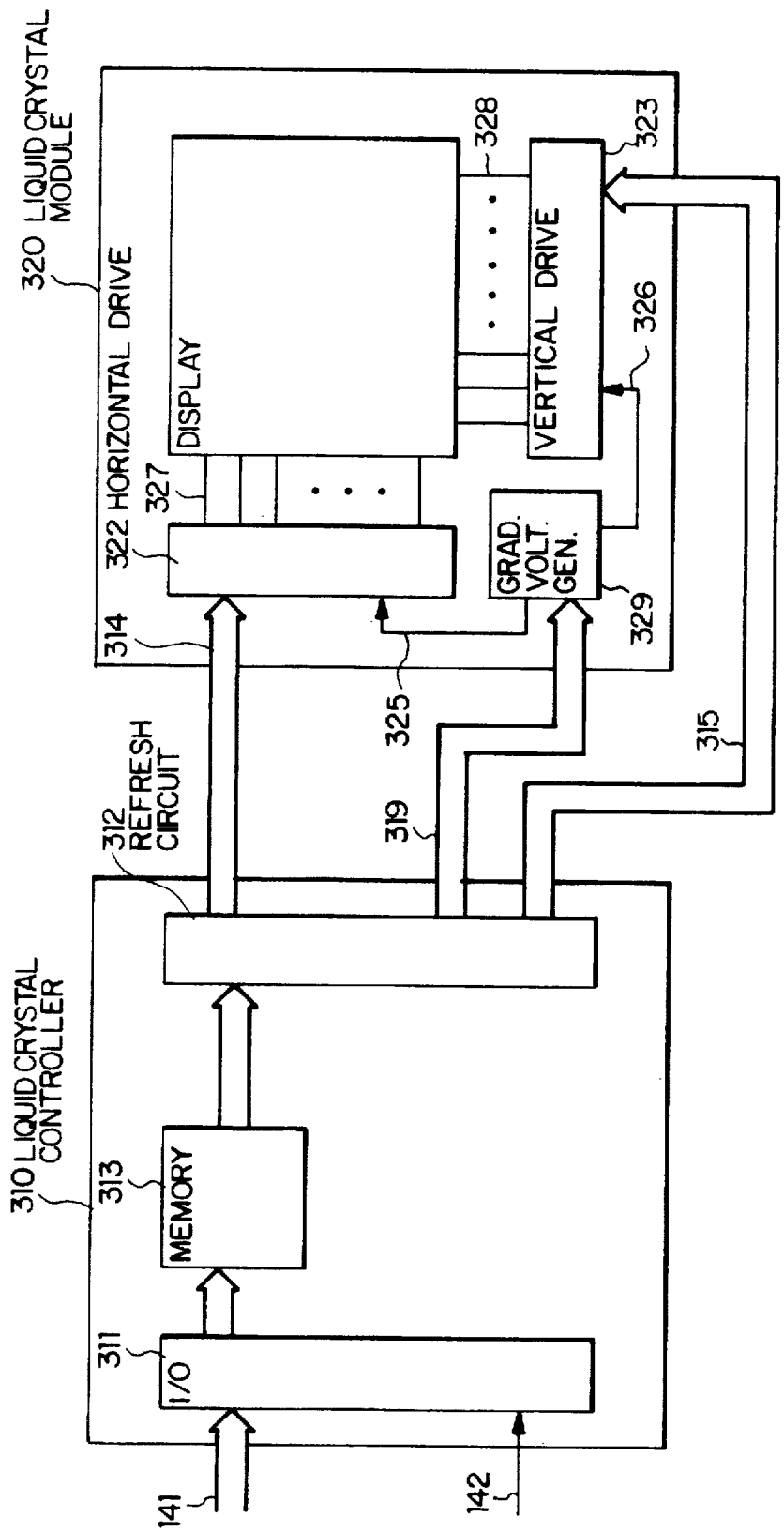
FIG. 20 is a block diagram showing the structure of the fourth embodiment of the invention of this application.

Referring to FIG. 20 in this embodiment, a gradation voltage generator 329 is provided in the liquid crystal module 320. The gradation voltage generator 329 generates a stepwise voltage (hereinafter referred to as gradation voltage) by a control signal sent from the refresh circuit 312 via a signal line 319, and supplies it to the horizontal drive 322 and the vertical drive 323. Supplied with a gradation voltage from the gradation voltage generator 329, the horizontal drive 322 and the vertical drive 323 control each cell of the matrix liquid crystal display element 321 to an intermediate state. An intermediate state means a state intermediate between transmission (on) and interception (off) and which allows transmission of light with a fixed transmissivity.

The structure of mask data 700 in this embodiment is described below.

Referring to FIG. 21, mask data 700 of this embodiment holds exposure time 718 and a transmissivity pattern 719. The transmissivity pattern 719 holds the transmissivity of each cell.

Next will be described a case in which matrix data 720 shown in FIG. 22 is stored in memory 120.

Simultaneously with the start of operation, the controller 100 reads mask data 720 from the memory 120 and sends the transmissivity pattern of mask data 720 to the liquid crystal controller 310. Having received the transmissivity pattern, the liquid crystal controller 310 matches the transmissivity of each cell of the matrix liquid crystal display element 321 with the received transmissivity pattern. The controller 100 turns on the light source 200 for mask data 720 exposure time.

Figure 23B:
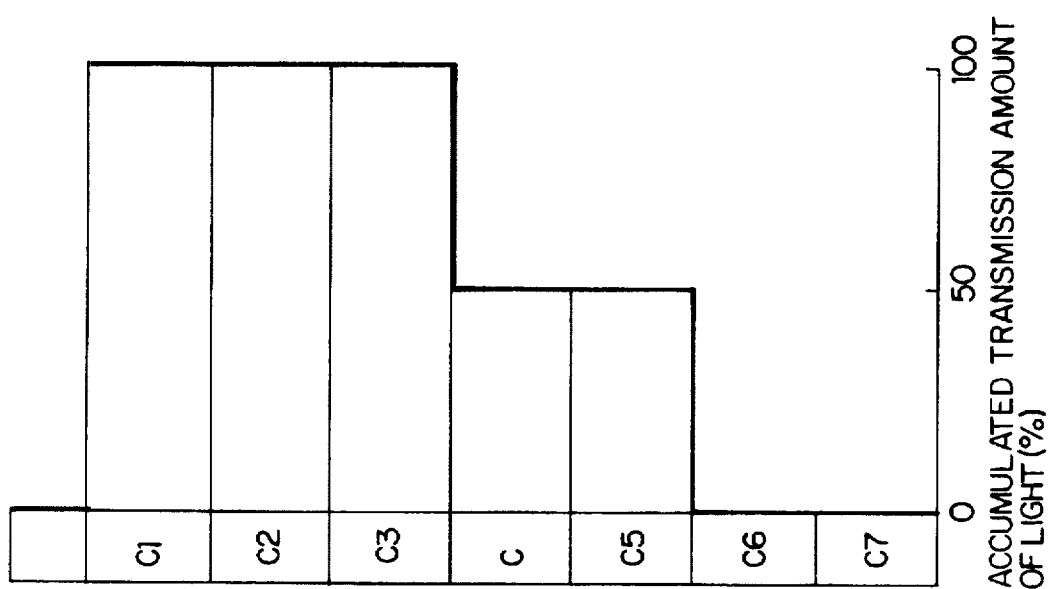
FIG. 23B shows the accumulated amount of transmitted light for each cell.
Figure 23A:
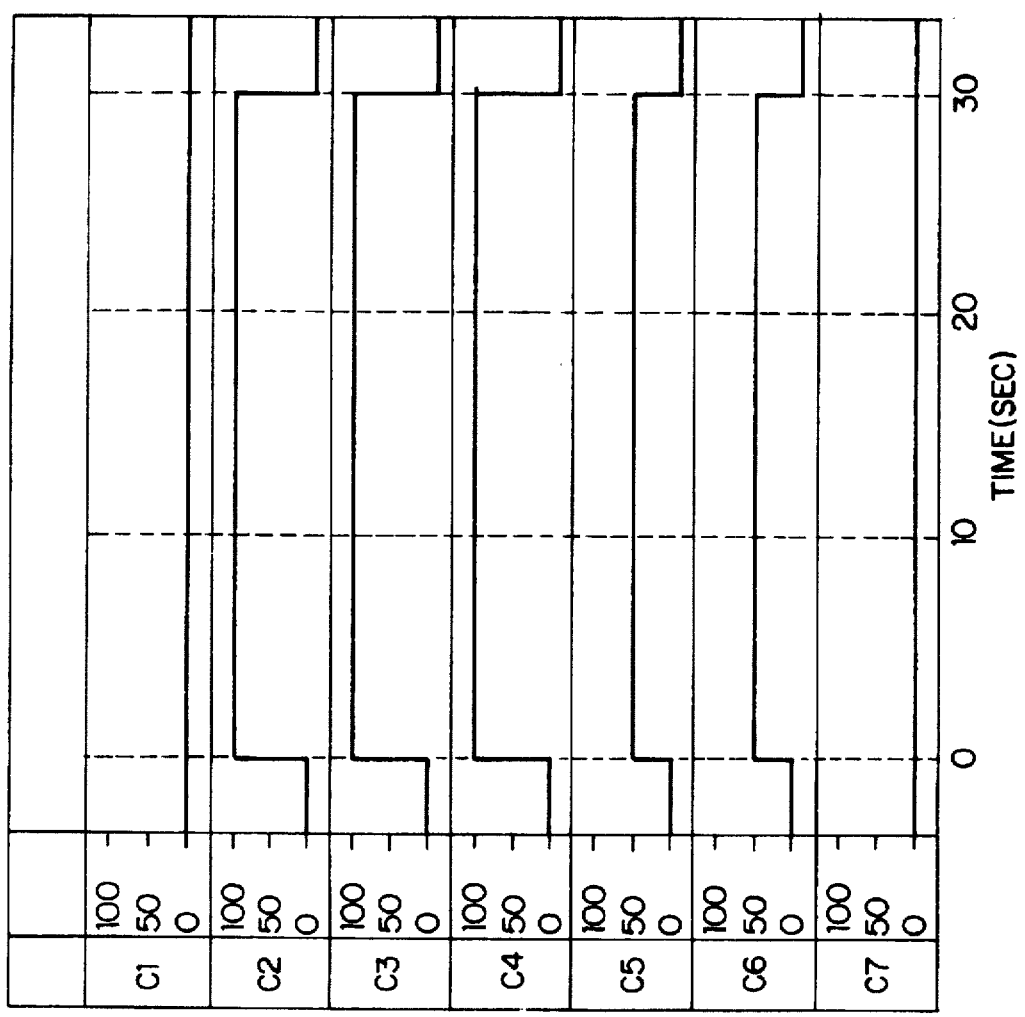
FIG. 23A is a timing chart showing the operation of the fourth embodiment of the present invention.

The transmissivity for cells C1–C7 is set to 0 percent for cells C1 and C7, 50 percent for cells C5 and C6, and 100 percent for cells C2–C4 as shown in FIG. 23A. The accumulated amount of the transmission light is shown in FIG. 23B. Referring to FIGS. 23B and 10B, the accumulated amount of the transmission light in this embodiment is the same as in FIG. 10B of the first embodiment. Thus, also in this embodiment, the positive photosensitive material 620 can be formed into the same shape as shown in FIG. 11.

The effect of this embodiment is described below.

In the fourth embodiment of the present invention, a gradation voltage generator 329 is provided in the liquid crystal module 320 to enable the transmissivity of each cell to be freely set. Consequently, as in the first embodiment, the section of the positive photosensitive material 620 can be formed into a desired shape. In addition, since the mask pattern of the matrix liquid crystal display element 321 does not change in the exposure process, exposure time can be accurately controlled.

The present invention is described below for a case in which it is applied to the formation of a negative photosensitive material. In the negative photosensitive material, the exposed part cures, and the uncured part is removed. In this case, the section of the photosensitive material can be formed into a shape which is totally different from what has been known. By way of example, a case is described in which a negative photosensitive material is exposed to light using the first embodiment of the present invention.

Figure 25B:
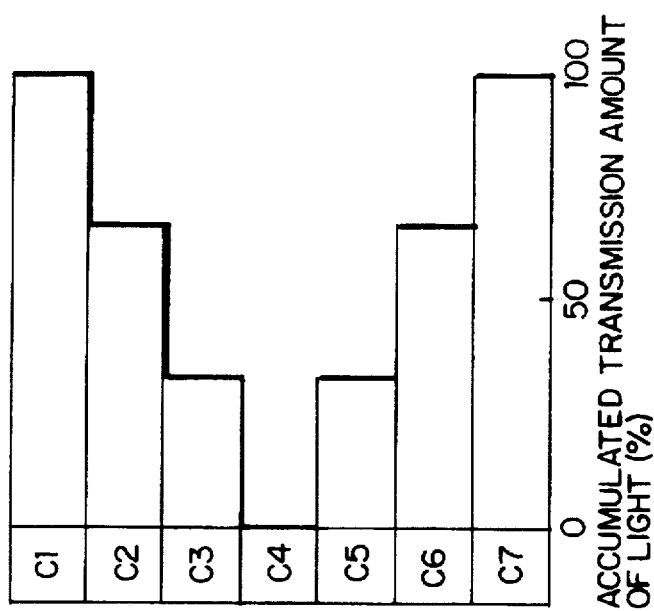
FIG. 25B shows the accumulated amount of transmitted light for each cell.
Figure 25A:
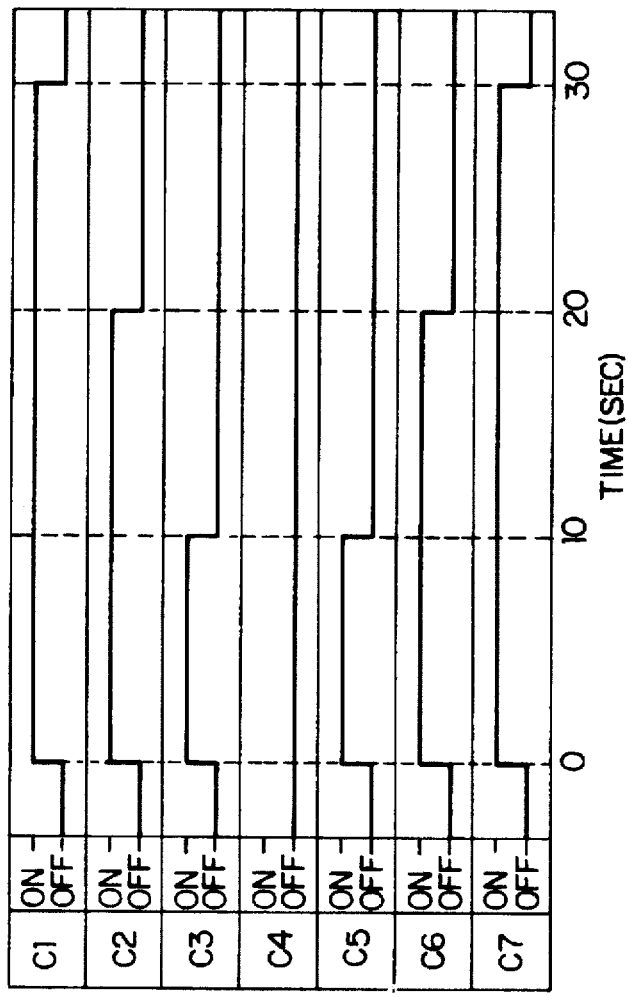
FIG. 25A is a timing chart showing the operation of the first embodiment of the invention of this application.

In the first embodiment, it is assumed that mask data 721–723 is stored in the memory 120. At this point, the state of each cell changes as shown in FIG. 25A. Further, the accumulated exposure value for each cell is shown in FIG. 25B. Referring to FIG. 1, from this operation, an uncured portion remains at the bottom of regions A2–A6 of the negative photosensitive material 650. Since the uncured portion of negative photosensitive material 650 is removed by subsequent treatment, the section of negative photosensitive material 650 is formed into a shape as shown in FIG. 26, with a hollow space formed in the material 650. Such a structure can not be formed by conventional technique.

Preferred negative photosensitive materials are listed as follows: For a thin film OMR-85 made by Tokyo Ouka Kogyo (KK), RU-1100N and PL-i400 made by Hitachi Kasei Kogyo (KK), and UR3100 made by Tohre (KK) are preferred negative photosensitive materials. For a thick film, a mixture of an inorganic oxide powder and a photosensitive vehicle is used. For a detailed composition of the mixture, reference is made to "Proceedings of the 1985 International Symposium on Microelectronics," The International Society for Hybrid Microelectronics, Reston, Va., 1985, pp. 373–379.

As this invention may be embodied in several forms without departing from the spirit of the essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A process for forming a photosensitive material for use in forming the sectional shape of the photosensitive material, the process for forming the photosensitive material comprising the steps of:

(a) applying a photosensitive material to a substrate;

(b) exposing the photosensitive material to light, an exposure time thereof being adjusted in three or more grades, said exposure time being calculated on the basis of a desired amount of accumulated exposed light; and (c) removing the uncured portion of said photosensitive material.

2. A process for forming a photosensitive material of claim 1 wherein:

said photosensitive material is a positive photosensitive material; and in step (b), said exposure time is adjusted so as to be small for a portion of the film thickness which is thick and so as to be large for a portion of the film thickness which is thin.

3. A process for forming a photosensitive material of claim 1 wherein:

said photosensitive material is a negative photosensitive material; and in step (b), a hollow space is formed in a first portion by making the exposure time of said first portion shorter than the other portions.

4. An exposure apparatus as set forth in claim 1 wherein said control means includes a first memory means for storing one of said plurality of mask patterns, a second memory means for storing an other one of said plurality of mask patterns, and a selector means for displaying either of a mask pattern stored in said first memory means or a mask pattern stored in said second memory means on said liquid crystal display element, and wherein in the switching of the mask pattern to be displayed on said liquid crystal display element, the mask pattern to be displayed next is stored in either of said first or second memory means, and thereafter said selector means selects one of said first and second memory means storing a memory pattern to be displayed next.

5. A process for forming a photosensitive material for use in forming a sectional shape of the photosensitive material, the process for forming a photosensitive material comprising the steps of:

(a) applying a photosensitive material to a substrate;

(b) storing, in a memory, a plurality of mask patterns;

(c) sequentially displaying said plurality of mask patterns on a liquid crystal display element under control of a controller;

(d) providing, for each of said plurality of mask patterns, light transmitted from a light source;

(e) passing said light from said light source through said each of said plurality of mask patterns displayed on said liquid crystal display element;

(f) exposing said photosensitive material to said light passed through said each of said plurality of mask patterns to cause a portion of said photosensitive material to be cured, said photosensitive material being exposed according to an exposure value adjustable in three grades, said exposure value corresponding to an amount of exposed light; and (g) removing a remainder portion of said photosensitive material, said remainder portion being uncured by said exposing step.

* * * * *

UNITED STATES PATENT AND TRADEMARK OFFICE
CERTIFICATE OF CORRECTION

PATENT NO. : 5,742,362
DATED : April 21, 1998
INVENTOR(S) : Shoichi CHIKAMICHI

It is certified that error appears in the above-identified patent and that said Letters Patent is hereby corrected as shown below:

On the title page,

In Item No. [30], Foreign Application Priority Data, change "Mar. 21, 1993" to --Jun. 21, 1993--.

Col. 10, Claim 1, lines 42-52, delete the claim in its entirety and replace with --1. An exposure apparatus comprising:
  a light source for irradiating light on a photosensitive material,
  a liquid crystal display element transmitting said light irradiated by said light source, said liquid crystal display element displaying a mask pattern, said mask pattern displayed on said liquid crystal display element intercepting said light,
  a memory means for storing a plurality of mask patterns to be displayed on said liquid crystal display element, and
  a control means for sequentially displaying the plurality of mask patterns stored in said memory means on said liquid crystal display element, the light transmitted through each of said plurality of mask patterns being irradiated onto said photosensitive material.--

Col. 10, Claim 2, lines 53-60, delete the claim in its entirety and replace with --2. An exposure apparatus of claim 1 wherein the exposure time corresponding to each of said plurality of mask patterns is also stored in said memory means, and
  said control means displays each of said plurality of mask patterns on said liquid crystal display element during the corresponding exposure time.--

UNITED STATES PATENT AND TRADEMARK OFFICE
CERTIFICATE OF CORRECTION

PATENT NO. : 5,742,362
DATED : April 21, 1998
INVENTOR(S) : Shoichi CHIKAMICHI

It is certified that error appears in the above-identified patent and that said Letters Patent is hereby corrected as shown below:

Col. 10, Claim 3, lines 61-67, delete the claim in its entirety and replace with --3. An exposure apparatus of claim 1 wherein said control means turns off said light source during the switching of display of said liquid crystal display element.--

Signed and Sealed this

Twenty-ninth Day of June, 1999

*Attest:*

Q. TODD DICKINSON

*Attesting Officer*     *Acting Commissioner of Patents and Trademarks*